(12) United States Patent
Nishimura et al.

(10) Patent No.: US 10,671,180 B2
(45) Date of Patent: Jun. 2, 2020

(54) INPUT DEVICE AND ELECTRONIC APPARATUS

(71) Applicant: SONY CORPORATION, Tokyo (JP)

(72) Inventors: Taizo Nishimura, Kanagawa (JP);
Hiroto Kawaguchi, Kanagawa (JP);
Hiroshi Mizuno, Kanagawa (JP);
Takashi Itaya, Kanagawa (JP); Akira Ebisui, Kanagawa (JP); Tomoko Katsuhara, Kanagawa (JP); Yoshiteru Taka, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 98 days.

(21) Appl. No.: 15/562,314

(22) PCT Filed: Feb. 16, 2016

(86) PCT No.: PCT/JP2016/000784
§ 371 (c)(1),
(2) Date: Sep. 27, 2017

(87) PCT Pub. No.: WO2016/163061
PCT Pub. Date: Oct. 13, 2016

(65) Prior Publication Data
US 2018/0348889 A1 Dec. 6, 2018

(30) Foreign Application Priority Data

Apr. 7, 2015 (JP) .................. 2015-078558

(51) Int. Cl.
*G06F 3/044* (2006.01)
*G06F 3/023* (2006.01)
(Continued)

(52) U.S. Cl.
CPC .............. *G06F 3/023* (2013.01); *G06F 3/016* (2013.01); *G06F 3/0202* (2013.01);
(Continued)

(58) Field of Classification Search
CPC ................................ G06F 3/044; G10H 1/055
(Continued)

(56) References Cited

U.S. PATENT DOCUMENTS

| 3,979,990 A * | 9/1976 | Hinago .................. G10H 1/055 84/719 |
| 2014/0354577 A1* | 12/2014 | Hanssen ................. G06F 3/044 345/174 |
| 2015/0090579 A1 | 4/2015 | Kurikawa et al. | |

FOREIGN PATENT DOCUMENTS

| CN | 104350566 A | 2/2015 |
| EP | 2860744 A1 | 4/2015 |

(Continued)

OTHER PUBLICATIONS

International Search Report and Written Opinion of PCT Application No. PCT/JP2016/000784, dated Apr. 19, 2016, 09 pages of ISRWO.

*Primary Examiner* — Abdul-Samad A Adediran
(74) *Attorney, Agent, or Firm* — Chip Law Group

(57) ABSTRACT

Provided are an input device and an electronic apparatus each including capacitive elements and being capable of allowing a plurality of information items to be separately input by simple operations. The input device includes: a capacitive element; a conductor that can be electrostatically coupled to the capacitive element; an operation portion that allows a load to be applied to the conductor; and a retaining portion that retains the conductor apart from the capacitive element. The retaining portion is capable of displacing the conductor with respect to the capacitive element in a stepwise manner in accordance with the load that is applied to the conductor through intermediation of the operation portion, and is capable of retaining the conductor at a plurality of positions with respect to the capacitive element.

11 Claims, 10 Drawing Sheets

(51) Int. Cl.
 G06F 3/02 (2006.01)
 H03M 11/12 (2006.01)
 H03M 11/10 (2006.01)
 H03M 11/24 (2006.01)
 G06F 3/01 (2006.01)
 H03K 17/96 (2006.01)
 H01H 13/85 (2006.01)

(52) U.S. Cl.
 CPC ............ *G06F 3/0233* (2013.01); *G06F 3/044* (2013.01); *H03K 17/9622* (2013.01); *H03M 11/10* (2013.01); *H03M 11/12* (2013.01); *H03M 11/24* (2013.01); *H01H 13/85* (2013.01); *H01H 2215/004* (2013.01); *H01H 2215/006* (2013.01); *H01H 2215/016* (2013.01); *H01H 2227/022* (2013.01); *H01H 2239/006* (2013.01); *H03K 2217/94036* (2013.01); *H03K 2217/96031* (2013.01); *H03K 2217/96073* (2013.01); *H03K 2217/960755* (2013.01)

(58) Field of Classification Search
 USPC .......................................... 345/174; 84/719
 See application file for complete search history.

(56) References Cited

FOREIGN PATENT DOCUMENTS

| | | |
|---|---|---|
| EP | 2983067 A1 | 2/2016 |
| JP | 2006-156170 A | 6/2006 |
| JP | 2011-070463 A | 4/2011 |
| JP | 2014-123430 A | 7/2014 |
| WO | 2013/187397 A1 | 12/2013 |
| WO | 2014/162647 A1 | 10/2014 |

* cited by examiner

INPUT DEVICE AND ELECTRONIC APPARATUS

CROSS REFERENCE TO RELATED APPLICATIONS

This application is a U.S. National Phase of International Patent Application No. PCT/JP2016/000784 filed on Feb. 16, 2016, which claims priority benefit of Japanese Patent Application No. JP 2015-078558 filed in the Japan Patent Office on Apr. 7, 2015. Each of the above-referenced applications is hereby incorporated herein by reference in its entirety.

TECHNICAL FIELD

The present technology relates to an input device and an electronic apparatus each including capacitive elements.

BACKGROUND ART

There has been known an input device for electronic apparatuses, which includes capacitive elements and is configured to be capable of detecting pressing positions and pressing forces with respect to an input operation plane of a controller (refer, for example, to Patent Literature 1).

CITATION LIST

Patent Literature

Patent Literature 1: Japanese Patent Application Laid-open No. 2006-156170

DISCLOSURE OF INVENTION

Technical Problem

The number of keys of an input device (such as QWERTY keyboard) is limited. Thus, generally, for example, a special character "#" cannot be input by simply operating "#" key, and "Shift" key and "3" key need to be simultaneously operated. Further, in order to copy and paste a character string, "Ctrl" key and corresponding one of "C" key and "V" key need to be simultaneously operated. The copy and paste operations are frequently used. Thus, particularly when these operations are repeated again and again, there is a risk that fingering is complicated. In addition, there is another risk that the repetitive simultaneous operations of the plurality of keys induce typing errors.

In view of such circumstances, the present technology has been made to achieve an object to provide an input device and an electronic apparatus each including capacitive elements and being capable of allowing a plurality of information items to be separately input by simple operations.

Solution to Problem

According to an embodiment of the present technology, there is provided an input device including:
a capacitive element;
a conductor that can be electrostatically coupled to the capacitive element;
an operation portion that allows a load to be applied to the conductor; and
a retaining portion that retains the conductor apart from the capacitive element. The retaining portion is capable of displacing the conductor with respect to the capacitive element in a stepwise manner in accordance with the load that is applied to the conductor through intermediation of the operation portion, and is capable of retaining the conductor at a plurality of positions with respect to the capacitive element.

According to this embodiment, the conductor is displaced with respect to the capacitive element in a stepwise manner in accordance with the load that is applied to the conductor through intermediation of the operation portion. With this, a plurality of different capacitance change amounts can be obtained in a stepwise manner respectively at multistage positions of the conductor with respect to the capacitive element. Thus, a user is allowed to separately input a plurality of information items in a stepwise manner only by applying the load to the conductor through pressing the single operation portion. Further, according to this embodiment, the conductor can be retained at the plurality of positions with respect to the capacitive element. With this, the user can tactilely recognize the multistage positions of the conductor with respect to the capacitive element through intermediation of the operation portion. As a result, erroneous inputs (erroneous operations) can be prevented, and high operability can be achieved.

The input device may further include a control unit that detects a plurality of different capacitance change amounts of the capacitive element respectively at the plurality of positions of the conductor with respect to the capacitive element, and outputs different information items corresponding to the plurality of detected different capacitance change amounts.

According to this embodiment, the user is allowed to separately input a plurality of information items in a stepwise manner corresponding to the multistage positions of the conductor with respect to the capacitive element. Further, the control unit is capable of separately outputting the plurality of information items corresponding to the multistage positions of the conductor with respect to the capacitive element.

The retaining portion may include a plurality of elastic mechanisms each being elastically deformable and respectively having different deformation resistances against the load that is applied to the conductor.

The plurality of elastic mechanisms may be elastically deformed at different timings in accordance with the load that is applied to the conductor such that the conductor is displaced in a stepwise manner with respect to the capacitive element.

The configuration of this embodiment includes a multi-stage key formed of the retaining portion, and hence is mechanically simple. Note that, specific examples of the "plurality of elastic mechanisms each being elastically deformable and respectively having different deformation resistances against the load that is applied to the conductor" of the retaining portion are given below.

As an example, the plurality of elastic mechanisms of the retaining portion may include parts that are inclined respectively at different angles with respect to a plane perpendicular to the spacing direction such that the plurality of elastic mechanisms respectively have the different deformation resistances against the load that is applied to the conductor.

As another example, the plurality of elastic mechanisms of the retaining portion may include a part having a straight cross-section and a part having a curved cross-section in a cross-section along the spacing direction such that the plurality of elastic mechanisms respectively have the different deformation resistances against the load that is applied to the conductor.

As still another example, the plurality of elastic mechanisms of the retaining portion may include parts respectively having different thicknesses such that the plurality of elastic mechanisms respectively have the different deformation resistances against the load that is applied to the conductor.

When the control unit detects a capacitance change amount equal to or more than a predetermined capacitance change amount for a predetermined period, the control unit may output an information item corresponding to the predetermined capacitance change amount.

According to this embodiment, the information item is output after the detection for the predetermined period, and hence erroneous inputs (erroneous operations) can be prevented.

The capacitive element may include a plurality of capacitive elements arranged in matrix.

When the control unit detects the capacitance change amount equal to or more than the predetermined capacitance change amount, and then detects that a position at which the capacitance change amount changes has shifted, the control unit may output the information item corresponding to the predetermined capacitance change amount.

According to this embodiment, the detection for the predetermined period is unnecessary, and hence a period from an operation of the operation portion to the output of the information item is reduced. As a result, satisfactory responsiveness to the user can be achieved.

When the control unit detects the capacitance change amount equal to or more than the predetermined capacitance change amount, and then detects that the position at which the capacitance change amount is detected has shifted, the control unit may output an information item corresponding to the predetermined capacitance change amount and to a position after the shifting.

According to this embodiment, different information items each corresponding not only to the predetermined capacitance change amount but also to the position after the shifting can be output. Thus, a larger number of information items can be input via a single operation portion.

According to another embodiment of the present technology, there is provided an electronic apparatus including:

a capacitive element;

a conductor that can be electrostatically coupled to the capacitive element;

an operation portion that allows a load to be applied to the conductor;

a retaining portion that retains the conductor apart from the capacitive element, the retaining portion being capable of displacing the conductor with respect to the capacitive element in a stepwise manner in accordance with the load that is applied to the conductor through intermediation of the operation portion, the retaining portion being capable of retaining the conductor at a plurality of positions with respect to the capacitive element; and a control unit that detects a plurality of different capacitance change amounts of the capacitive element respectively at the plurality of positions of the conductor with respect to the capacitive element, and outputs different information items corresponding to the plurality of detected different capacitance change amounts.

Advantageous Effects of Invention

As described hereinabove, according to the present technology, an input device and an electronic apparatus each including capacitive elements are enabled to allow a plurality of information items to be separately input by simple operations.

Note that, the advantages disclosed herein are not necessarily limited to those described hereinabove, and all of the advantages disclosed herein can be obtained.

MODES FOR CARRYING OUT THE INVENTION

Now, embodiments of the present technology are described with reference to the drawings.

1. First Embodiment (1-1. Electronic Device)

Figure 1:
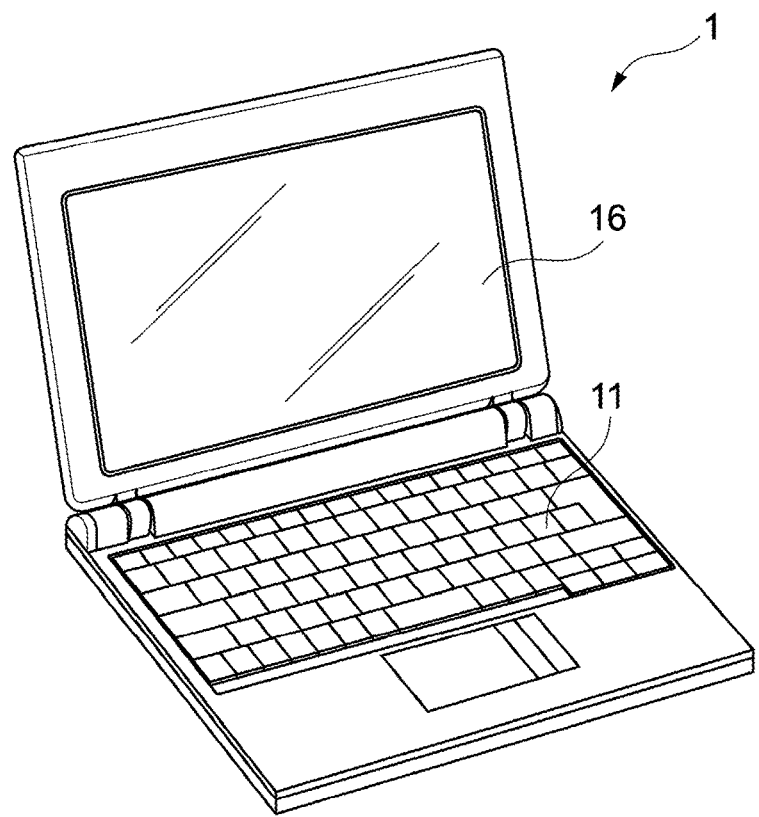
FIG. 1 is a perspective view of an electronic apparatus (input device) according to a first embodiment of the present technology.

FIG. 1 is a perspective view of an electronic apparatus 1 (input device) according to a first embodiment of the present technology.

The electronic apparatus 1 includes an input unit 11 including a capacitive keyboard, and a display unit 16. The electronic apparatus 1 is, for example, a laptop personal computer.

Figure 2:
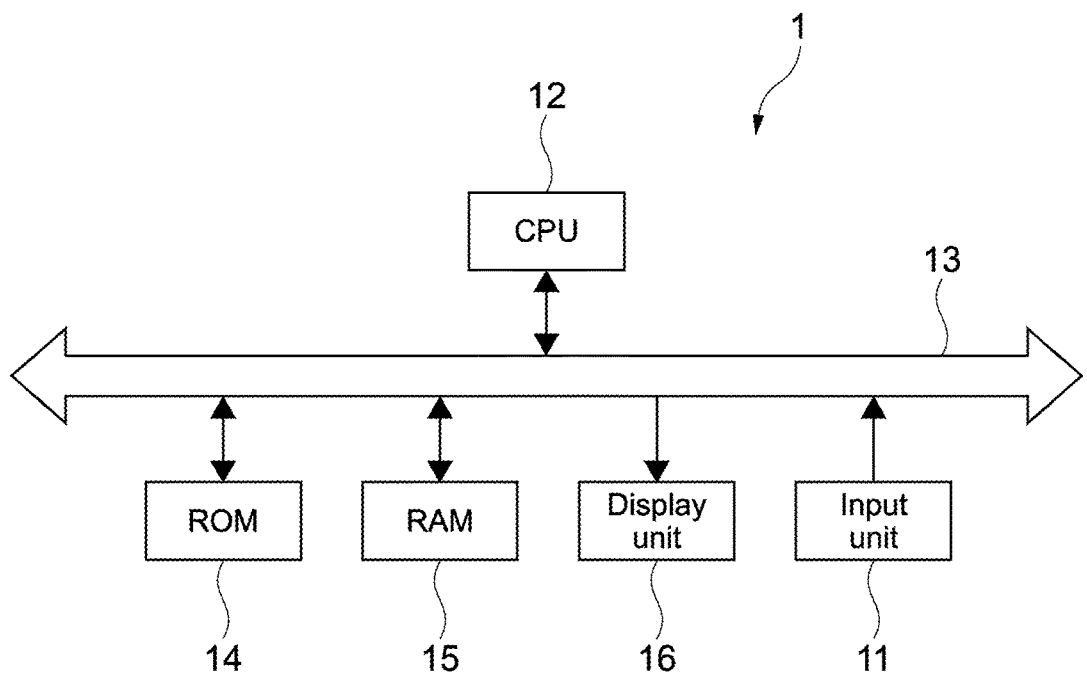
FIG. 2 is a block diagram of a hardware configuration of the electronic apparatus.

FIG. 2 is a block diagram of a hardware configuration of the electronic apparatus 1.

As shown in FIG. 2, in the electronic apparatus 1, a read only memory (ROM) 14, a random access memory 15 (RAM), the display unit 16, and the input unit 11 are connected to a central processing unit (CPU) 12 via a system bus 13.

The ROM 14 fixedly stores, for example, programs that are executed by the CPU 12, and data. The programs stored in the ROM 14 are loaded into the RAM 15. The CPU 12 executes the loaded programs. The display unit 16 executes an arithmetic process based on information items received from the CPU 12, and displays generated video signals. The input unit 11 supplies information items corresponding to keys that are operated by a user to the CPU 12.

(1-2. Input Unit)

Figure 3:
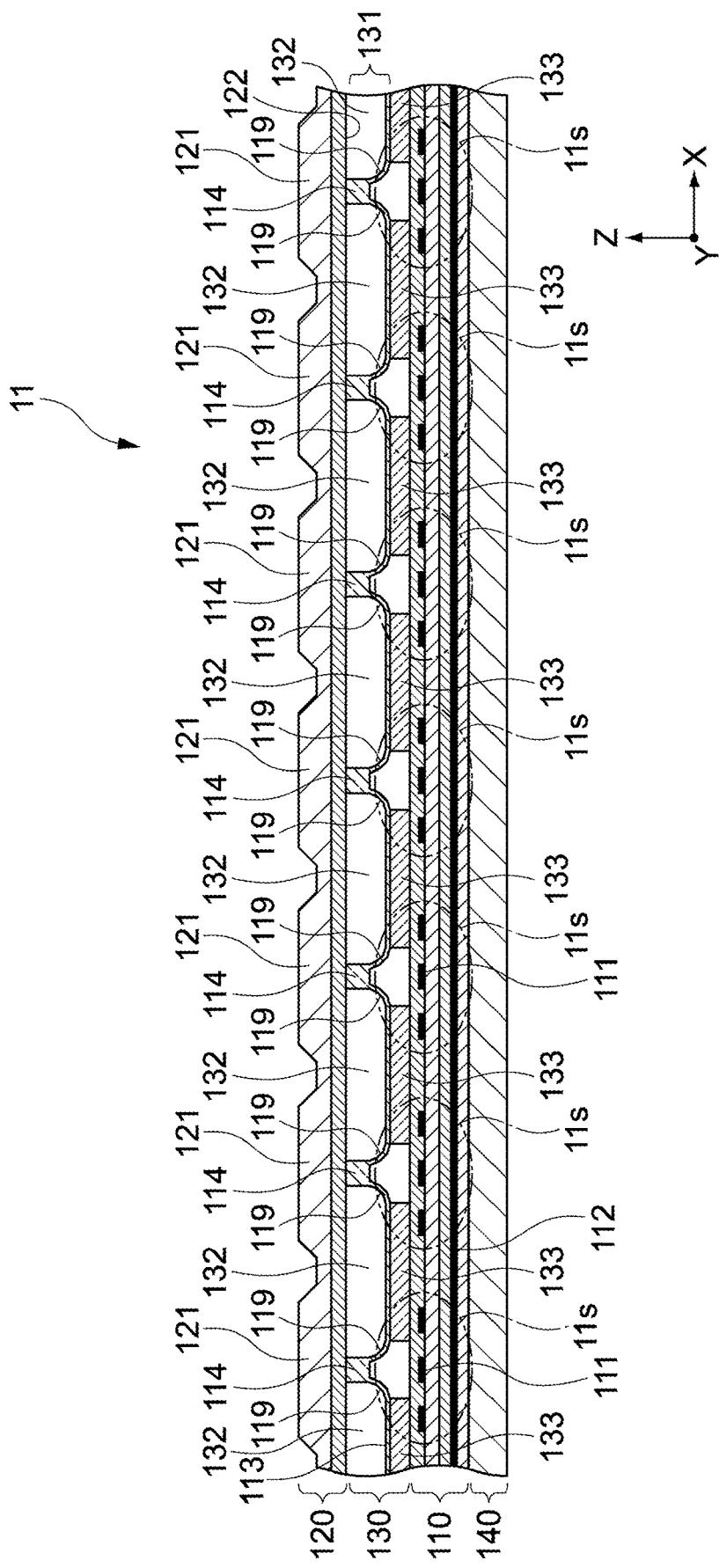
FIG. 3 is a main-part cross-sectional view of a configuration example of an input unit.

FIG. 3 is a main-part cross-sectional view of a configuration example of the input unit 11.

The input unit 11 is formed of a laminated body including a sensor sheet 110 including a plurality of capacitive elements 11s arranged in matrix in the X-Y plane, a flexible sheet 120 including a plurality of key tops 121 (operation portions), a retaining layer 130, and a base layer 140.

The flexible sheet 120 is formed, for example, of a flexible insulating plastic film such as a polyethylene terephthalate (PET) film, and has an outer surface including the plurality of key tops 121. On an opposite side with respect to the plurality of key tops 121, a deformable conductive layer 122 facing the plurality of capacitive elements 11s is arranged under an inner surface of the flexible sheet 120. The conductive layer 122 can be electrostatically coupled to all the plurality of capacitive elements 11s. The conductive layer 122 is typically connected to a ground potential, specifically, to the inner surface of the flexible sheet 120 through intermediation of an adhesive layer (not shown). Note that, the flexible sheet 120 is not necessarily limited to the insulating plastic, and may be made of glass as long as deformability can be secured. For example, the flexible sheet 120 may be a liquid crystal display (LCD).

The sensor sheet 110 includes a plurality of first electrode wires 111 extending in the Y-axis direction and arrayed at intervals in the X-axis direction, and a plurality of second electrode wires 112 extending in the X-axis direction and arrayed at intervals in the Y-axis direction. The plurality of capacitive elements 11s are formed of intersecting portions of the plurality of first electrode wires 111 and the plurality of second electrode wires 112, and function as sensors capable of respectively detecting capacitances at these intersecting portions.

The sensor sheet 110 is typically formed by laminating, on each other through intermediation of an adhesive layer, a deformable insulating plastic film that supports the first electrode wires 111, and a deformable insulating plastic film that supports the second electrode wires 112. The plurality of capacitive elements 11s are connected to an oscillator circuit (not shown), and the respective capacitances of the plurality of capacitive elements 11s are separately calculated by the CPU 12 (or by a dedicated signal processing circuit).

The retaining layer 130 includes a retaining film 131, and a joining layer 133 that joins the retaining film 131 and the sensor sheet 110 to each other. The retaining film 131 is arranged between the sensor sheet 110 and the flexible sheet 120, and is configured to elastically support the plurality of key tops 121 with respect to the sensor sheet 110. The retaining film 131 includes base portions 113 that are joined to the joining layer 133, a plurality of substantially-truncated-conical dome portions 119 (retaining portions) that rise from the base portions 113, and conductive-layer setting portions 114 which are arranged at tops of the dome portions 119 and over which the conductive layer 122 is set. The retaining film 131 further includes space portions 132 formed between the plurality of dome portions 119. The plurality of dome portions 119 are arranged between the sensor sheet 110 and corresponding ones of the plurality of key tops 121. The plurality of dome portions 119 are elastically deformable in a thickness direction (Z-axis direction), and elastically retain the corresponding ones of the plurality of key tops 121 with respect to the sensor sheet 110. Typically, the retaining film 131 is made of a resin material such as polyethylene terephthalate (PET), polyethylene naphthalate (PEN), and polycarbonate (PC). Note that, in FIG. 3 and subsequent cross-sectional views, for better visibility, rear of the dome portions is not illustrated, and the domes portion are illustrated only in cross-section.

The base layer 140 is formed of an insulating plastic film. The base layer 140, which is used as a mount that allows the sensor sheet 110 to be fixed to a casing of the electronic apparatus 1, may be omitted when unnecessary. Note that, the base layer 140 formed of the insulating plastic film need not necessarily be arranged, and a conductive layer may be arranged for noise reduction.

The input unit 11 configured as described above is capable of detecting a pressing force to the key top 121 based on the capacitance of the capacitive element 11s, which changes in accordance with a clearance between the conductive layer 122 and the sensor sheet 110 (displacement amount of the conductive layer 122) in response to an input operation of the key top 121. Further, when a finger applying an operation load is moved parallel to the X-Y plane, deformations of the key tops 121 shift in a manner of following an operating position. With this, coordinates of the position at which the input operation is performed, or changes of the coordinates, and a load that is applied to that position can be detected.

Note that, as typical examples of the configuration that elastically supports the plurality of key tops 121 with respect to the sensor sheet 110, there are provided a support structure that prevents erroneous inputs to adjacent keys, and an immovable support structure that supports outer peripheries thereof (none of which is shown).

(1-3. Dome Portion)

Figure 4:
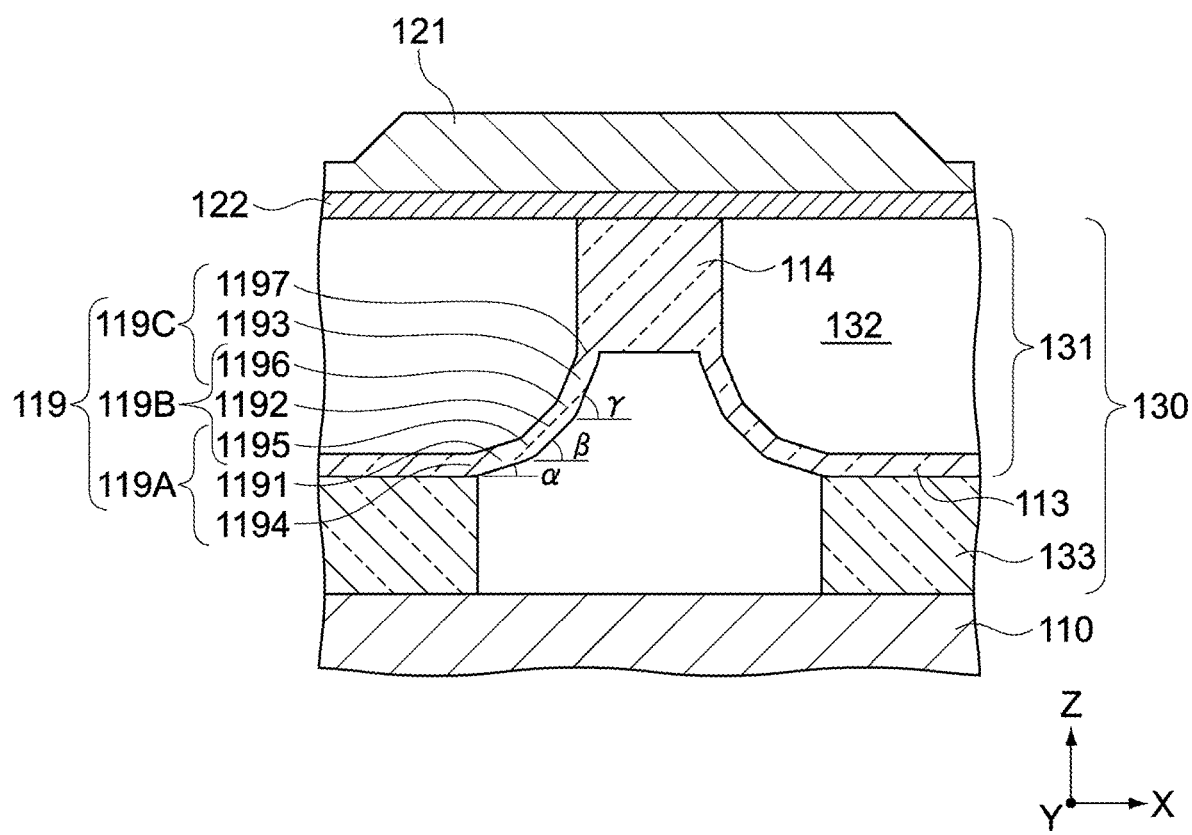
FIG. 4 is a schematic cross-sectional view of a configuration example of a dome portion.

FIG. 4 is a schematic cross-sectional view of a configuration example of the dome portion 119.

The dome portion 119 refers to a retaining portion that retains the conductive layer 122 apart from the capacitive element 11s (FIG. 3). The dome portion 119 is capable of changing a position of the conductive layer 122 with respect to the capacitive element 11s in a stepwise manner in accordance with a load that is applied to the conductive layer 122 through intermediation of the key top 121, thereby being capable of retaining the conductive layer 122 at a plurality of positions with respect to the capacitive element 11s.

The substantially-truncated-conical dome portion 119 includes a first elastic mechanism 119A, a second elastic mechanism 119B, and a third elastic mechanism 119C each being elastically deformable and respectively having different deformation resistances or rigidities against the load that is applied to the conductive layer 122 through intermediation of the key top 121 (hereinafter, referred to as deformation resistances). The first, the second, and the third elastic mechanisms 119A, 119B, and 119C are arranged in this order from the sensor sheet 110 side including the capacitive element 11s (FIG. 3) toward the conductive layer 122 side and adjacent to each other in the Z direction (direction in which the sensor sheet 110 including the capacitive element 11s (FIG. 3) and the conductive layer 122 are spaced apart from each other). Note that, in the following, the direction in which the sensor sheet 110 including the capacitive element 11s (FIG. 3) and the conductive layer 122 are spaced apart from each other is referred to as the "Z direction."

The first elastic mechanism 119A, the second elastic mechanism 119B, and the third elastic mechanism 119C respectively include a first part 1191, a second part 1192, and a third part 1193. The first, the second, the third parts 1191, 1192, and 1193 are annular bodies that respectively have different upper-end diameters, lower-end diameters, and heights, and cooperatively form a side surface of the substantially-truncated-conical dome portion 119. The first elastic mechanism 119A includes, in addition to the first part 1191, an annular rising part 1194 rising from the base portion 113, and an annular first boundary portion 1195 being a boundary between the first part 1191 and the second part 1192. The second elastic mechanism 119B includes, in addition to the second part 1192, the first boundary portion 1195, and an annular second boundary portion 1196 being a boundary between the second part 1192 and the third part 1193. The third elastic mechanism 119C includes, in addition to the third part 1193, the second boundary portion 1196, and an annular third boundary portion 1197 being a boundary between the third part 1193 and the conductive-layer setting portion 114.

The first part 1191, the second part 1192, and the third part 1193 of the first, the second, and the third elastic mechanisms 119A, 119B, and 119C are inclined respectively at different angles with respect to the X-Y plane perpendicular to the Z direction. With this, the first, the second, and the third elastic mechanisms 119A, 119B, and 119C respectively have the different deformation resistances against the load that is applied to the conductive layer 122 through intermediation of the key top 121. In other words, the first, the second, and the third elastic mechanisms 119A, 119B, and 119C respectively have different deformation resistances against a load in the −Z direction. More specifically, the first, the second, and the third parts 1191, 1192, and 1193 incline respectively at different angles α, β, and γ with respect to the X-Y plane. In this case, a relationship of α<β<γ is established. Typically, the deformation resistances against the load in the −Z direction (vertical direction) become lower as the inclination angles become lower (closer to the horizon), and become higher as the inclination angles become higher (closer to the vertical). Thus, in the case of α<β<γ, a relationship of (deformation resistance of the first part 1191)<(deformation resistance of the second part 1192)<(deformation resistance of the third part 1193) is established. Therefore, a relationship of (deformation resistance of the first elastic mechanism 119A including the first part 1191)<(deformation resistance of the second elastic mechanism 119B including the second part 1192)<(deformation resistance of the third elastic mechanism 119C including the third part 1193) is established.

(1-4. Elastic Displacement of Dome Portion and Capacitance Change Amount in Accordance Therewith)

As described above, the dome portion 119 includes the first elastic mechanism 119A, the second elastic mechanism 119B, and the third elastic mechanism 119C each being elastically deformable and respectively having the different deformation resistances against the load that is applied to the conductive layer 122 through intermediation of the key top 121. The first, the second, and the third elastic mechanisms 119A, 119B, and 119C are elastically deformed (flexurally deformed) at different timings in accordance with the load that is applied to the conductive layer 122 through intermediation of the key top 121. With this, the position of the conductive layer 122 with respect to the sensor sheet 110 including the capacitive elements 11s (FIG. 3) is changed in a stepwise manner. Now, with reference to FIGS. 5 to 8, elastic displacement of the dome portion 119 and a capacitance change amount in accordance therewith are described in more detail.

Figure 5:
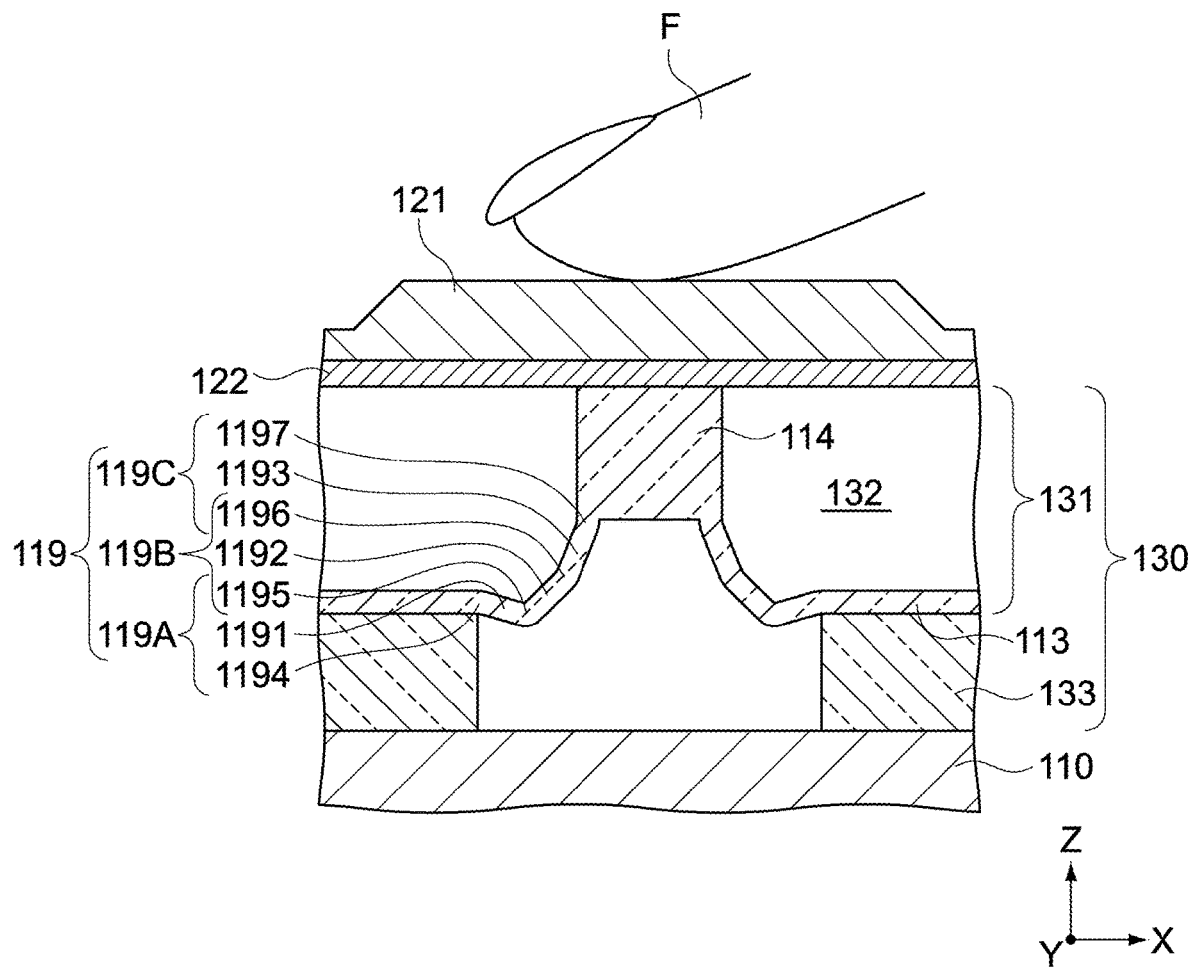
FIG. 5 is a view illustrating how the dome portion is elastically deformed by a load applied thereto.
Figure 6:
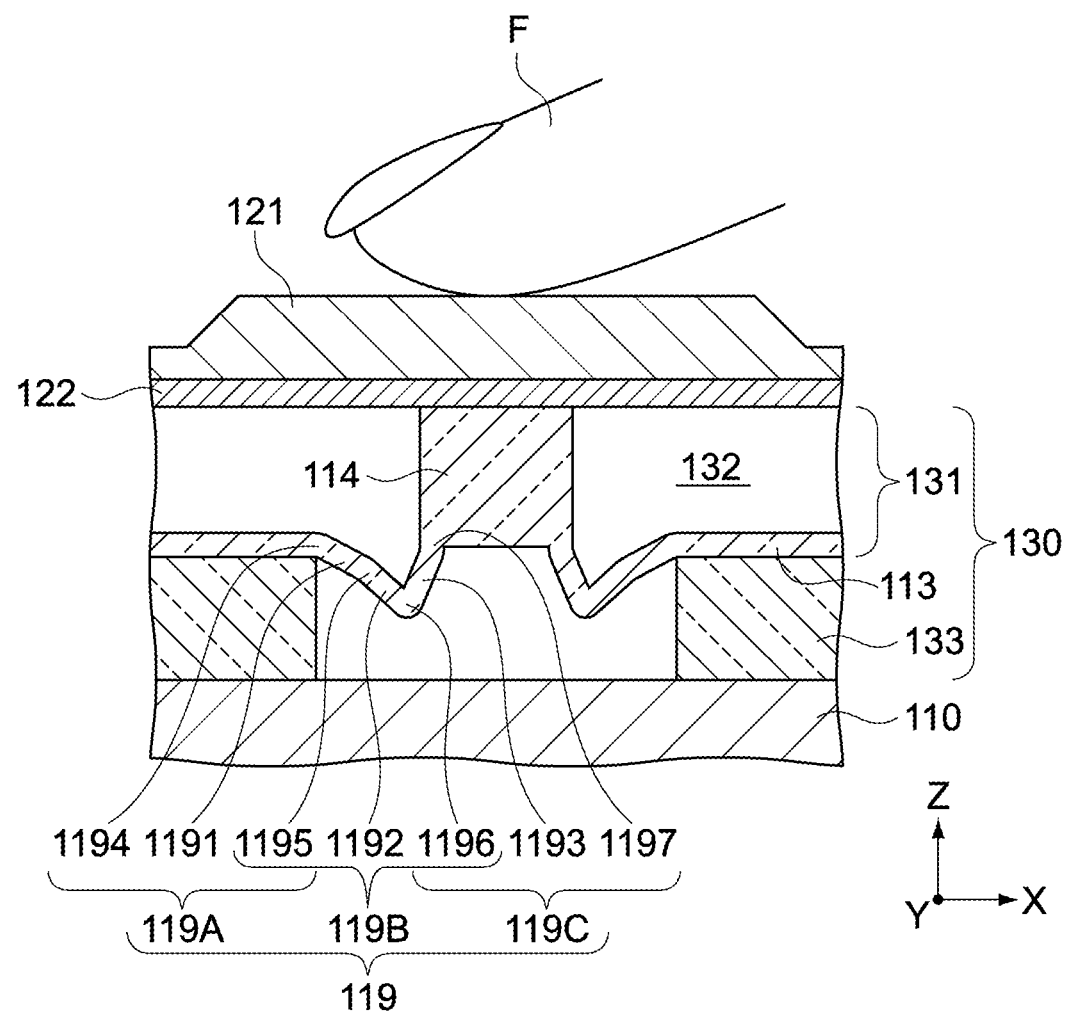
FIG. 6 is another view illustrating how the dome portion is elastically deformed by the load applied thereto.
Figure 7:
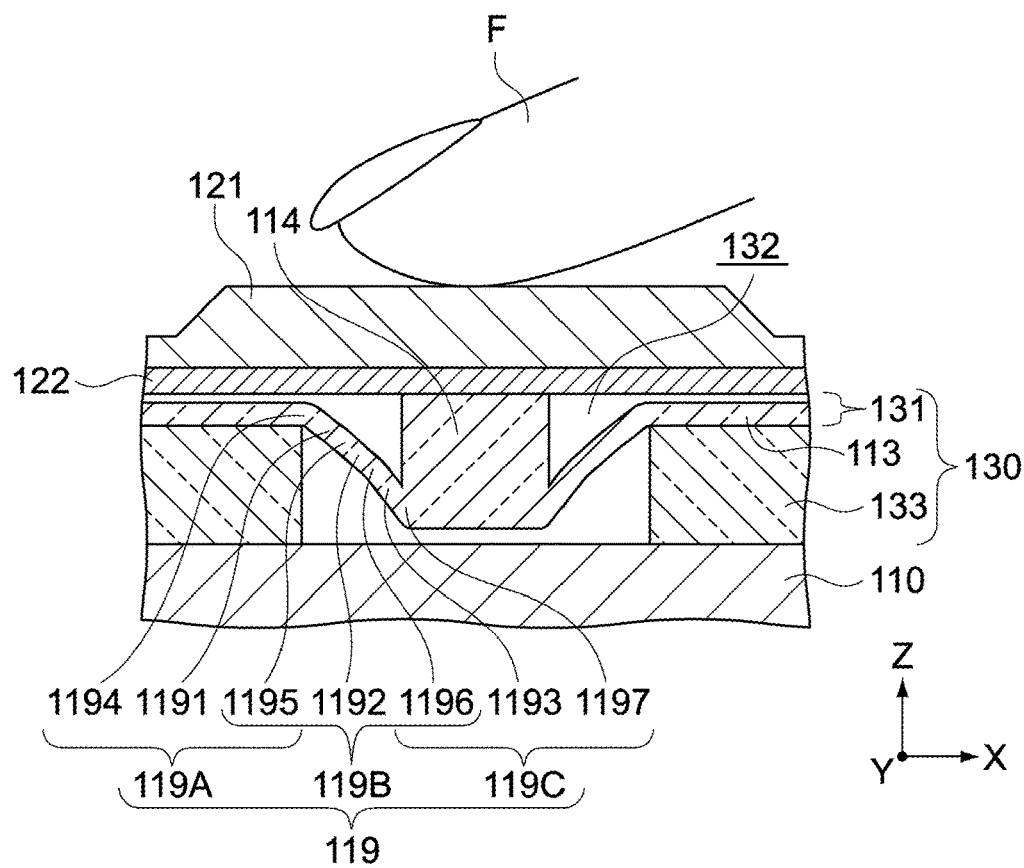
FIG. 7 is still another view illustrating how the dome portion is elastically deformed by the load applied thereto.
Figure 8:
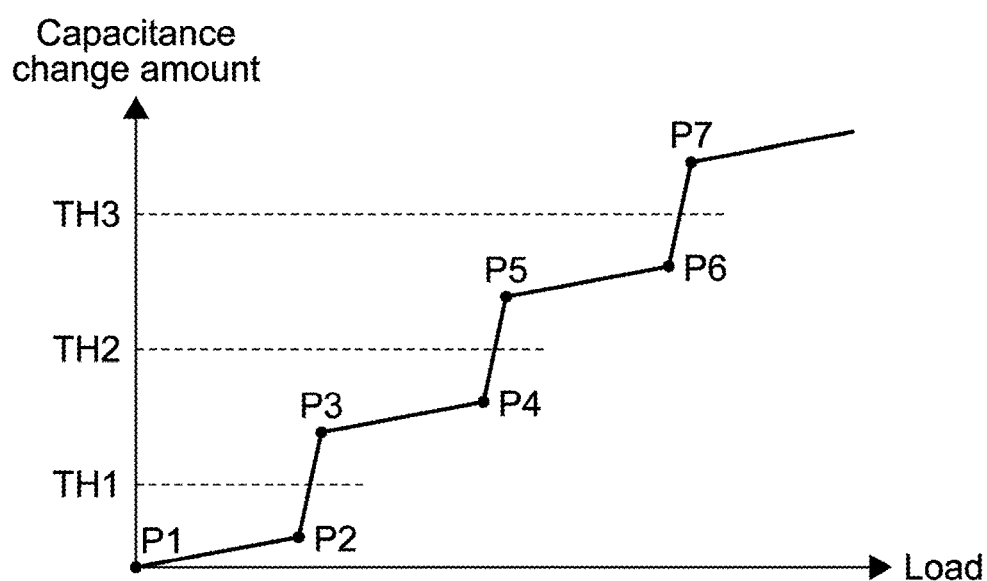
FIG. 8 is a graph schematically showing a capacitance change amount at the time when the dome portion is elastically deformed by the load applied thereto.

FIGS. 5, 6, and 7 are views sequentially illustrating how the dome portion 119 is elastically deformed by the load applied thereto. FIG. 8 is a graph schematically showing the capacitance change amount at the time when the dome portion 119 is elastically deformed by the load applied thereto.

Under a state in which the operation load is not applied to the key top 121, the dome portion 119 maintains its initial shape illustrated in FIG. 4 (point P1 in FIG. 8). In this state, the user presses, with his/her finger F, the key top 121 in a direction having a component in the −Z direction. With this, the load in the −Z direction starts to be applied to the key top 121. Then, the first elastic mechanism 119A having the lowest deformation resistance starts to be elastically deformed. Specifically, with respect to the rising part 1194 being one end of the first elastic mechanism 119A, the first boundary portion 1195 being another end of the same starts to gradually move in the −Z direction (points P1 to P2 in FIG. 8). With this, the conductive layer 122 arranged under the key top 121 starts to gradually come closer to the sensor sheet 110 including the capacitive elements 11s (FIG. 3). Thus, the capacitance change amount starts to gradually increase. When the load that is applied to the key top 121 exceeds a predetermined value, a load bearing capability of the first elastic mechanism 119A sharply decreases. As a result, the first elastic mechanism 119A is elastically deformed in a manner that the first boundary portion 1195 intensively moves in the −Z direction (point P3 in FIG. 8). At this moment, the user feels that a repulsive force to the finger F sharply decreases. When the elastic deformation of the first elastic mechanism 119A stops (point P3 in FIG. 8), the first boundary portion 1195 is located closer to the sensor sheet 110 than any other parts of the dome portion 119 (FIG. 5). When the first boundary portion 1195 intensively moves in the −Z direction, the conductive layer 122 intensively comes close to the capacitive element 11s. Thus, the capacitance change amount sharply increases to exceed a threshold TH1 (FIG. 8). The user feels that the repulsive force to the finger F sharply increases at the moment when the elastic deformation of the first elastic mechanism 119A stops. In other words, the user feels, as a first click feeling, the feeling of sharp decrease of the repulsive force when the load bearing capability of the first elastic mechanism 119A sharply decreases, and the feeling of sudden increase of the repulsive force when the elastic deformation of the first elastic mechanism 119A stops.

Subsequently, the user further presses, with the finger F, the key top 121 in the direction having the component in the −Z direction. With this, the load in the −Z direction restarts to be applied to the key top 121. Then, the second elastic mechanism 119B having the second lowest deformation resistance starts to be elastically deformed. Specifically, with respect to the first boundary portion 1195 being one end of the second elastic mechanism 119B, the second boundary portion 1196 being another end of the same starts to gradually move in the −Z direction (points P3 to P4 in FIG. 8). With this, the conductive layer 122 arranged under the key top 121 starts to gradually come closer to the sensor sheet 110 including the capacitive elements 11s (FIG. 3). Thus, the capacitance change amount starts to gradually increase. When the load that is applied to the key top 121 exceeds a predetermined value, a load bearing capability of the second elastic mechanism 119B sharply decreases. As a result, the second elastic mechanism 119B is elastically deformed in a manner that the second boundary portion 1196 intensively moves in the −Z direction (point P5 in FIG. 8). At this moment, the user feels that the repulsive force to the finger F sharply decreases. When the elastic deformation of the second elastic mechanism 119B stops (point P5 in FIG. 8), the second boundary portion 1196 is located closer to the sensor sheet 110 than any other parts of the dome portion 119 (FIG. 6). When the second boundary portion 1196 intensively moves in the −Z direction, the conductive layer 122 intensively comes close to the capacitive element 11s. Thus, the capacitance change amount sharply increases to exceed a threshold TH2 (TH1<TH2) (FIG. 8). The user feels that the repulsive force to the finger F sharply increases at the moment when the elastic deformation of the second elastic mechanism 119B stops. In other words, the user feels, as a second click feeling, the feeling of sharp decrease of the repulsive force when the load bearing capability of the second elastic mechanism 119B sharply decreases, and the feeling of sudden increase of the repulsive force when the elastic deformation of the second elastic mechanism 119B stops.

Subsequently, the user further presses, with the finger F, the key top 121 in the direction having the component in the −Z direction. With this, the load in the −Z direction restarts to be applied to the key top 121. Then, the third elastic mechanism 119C having the highest deformation resistance starts to be elastically deformed. Specifically, with respect to the second boundary portion 1196 being one end of the third elastic mechanism 119C, the third boundary portion 1197 being another end of the same starts to gradually move in the −Z direction (points P5 to P6 in FIG. 8). With this, the conductive layer 122 arranged under the key top 121 starts to gradually come closer to the sensor sheet 110 including the capacitive elements 11s (FIG. 3). Thus, the capacitance change amount starts to gradually increase. When the load that is applied to the key top 121 exceeds a predetermined value, a load bearing capability of the third elastic mechanism 119C sharply decreases. As a result, the third elastic mechanism 119C is elastically deformed in a manner that the third boundary portion 1197 intensively moves in the −Z direction (point P7 in FIG. 8). At this moment, the user feels that the repulsive force to the finger F sharply decreases. When the elastic deformation of the third elastic mechanism 119C stops (point P7 in FIG. 8), the third boundary portion 1197 is located closer to the sensor sheet 110 than any other parts of the dome portion 119 (FIG. 7). When the third boundary portion 1197 intensively moves in the −Z direction, the conductive layer 122 intensively comes close to the capacitive element 11s. Thus, the capacitance change amount sharply increases to exceed a threshold TH3 (TH1<TH2<TH3) (FIG. 8). The user feels that the repulsive force to the finger F sharply increases at the moment when the elastic deformation of the third elastic mechanism 119C stops. In other words, the user feels, as a third click feeling, the feeling of sharp decrease of the repulsive force when the load bearing capability of the third elastic mechanism 119C sharply decreases, and the feeling of sudden increase of the repulsive force when the elastic deformation of the third elastic mechanism 119C stops.

When the user feels a desired click feeling (the first, the second, or the third click feeling), typically, the user releases the finger F from the key top 121 so as to discontinue the load application to the key top 121. With this, the dome portion 119 restores to the original shape (FIG. 4) by its elastic force.

(1-5. Control Unit)

As described above, the dome portion 119 is capable of changing the position of the conductive layer 122 with respect to the capacitive element 11s in a stepwise manner in accordance with the load that is applied to the conductive layer 122 through intermediation of the key top 121, thereby being capable of retaining the conductive layer 122 at the plurality of positions with respect to the capacitive element 11s. Further, the CPU 12 (control unit) detects a plurality of different capacitance change amounts of the capacitive element 11s respectively at the plurality of positions of the conductive layer 122 with respect to the capacitive element 11s (less than TH1, TH1 or more and less than TH2, TH2 or more and less than TH3, and TH3 or more). The CPU 12 (control unit) outputs different information items corresponding to the plurality of detected capacitance change amounts (less than TH1, TH1 or more and less than TH2, TH2 or more and less than TH3, and TH3 or more).

Specifically, in a case where the input unit 11 is a QWERTY keyboard, a plurality of information items are assigned to each of the capacitive elements 11s. For example, a plurality of different information items "1," "!," and "NU" are assigned to the capacitive element 11s corresponding to a certain one key top 121 (arranged directly under the key top 121). The CPU 12 outputs, in accordance respectively with the plurality of detected different capacitance change amounts (TH1 or more and less than TH2, TH2 or more and less than TH3, TH3 or more), the plurality of different information items ("1," "!," and "NU"). Now, with reference to FIG. 9, an example of a specific operation of the CPU 12 is described in more detail.

Figure 9:
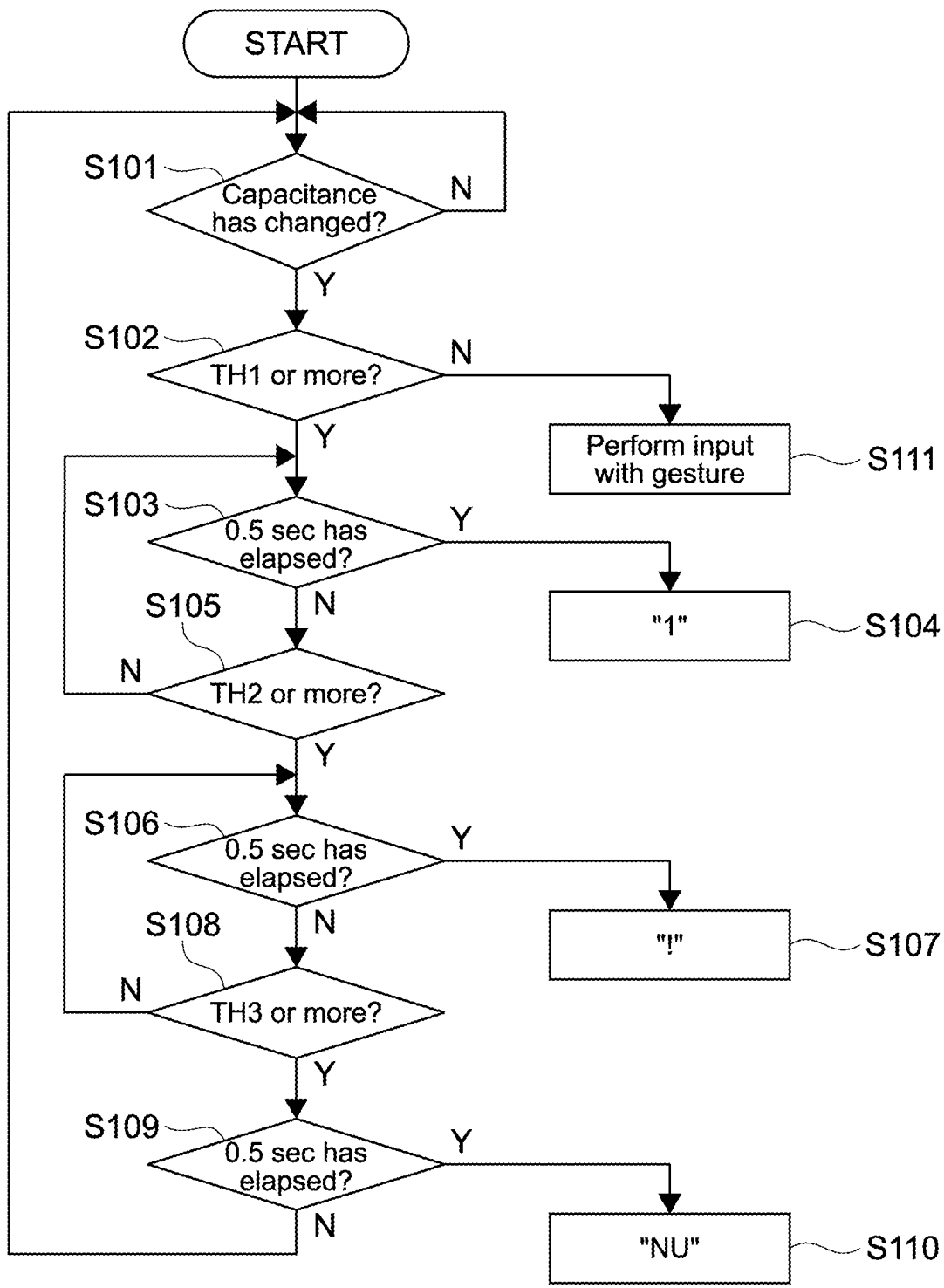
FIG. 9 is a flowchart showing an example of an operation of a CPU (control unit) according to the first embodiment.

FIG. 9 is a flowchart showing the example of the operation of the CPU 12 (control unit) according to the first embodiment.

The CPU 12 detects that a capacitance of the capacitive element 11s corresponding to a certain one key top 121 (arranged directly under the key top 121) has changed (Y in S101), and then detects that a capacitance change amount of this capacitive element 11s has reached the threshold TH1 (Y in S102). In this case, when the CPU 12 detects a capacitance change amount equal to or more than TH1 and less than TH2 for a predetermined period (for example, for 0.5 seconds) (Y in S103), the CPU 12 outputs the information item "1," which is assigned to a combination of this capacitive element 11s and the threshold TH1 (S104). In short, when the CPU 12 detects a predetermined capacitance change amount or more for a predetermined period, the CPU 12 outputs an information item corresponding to the predetermined capacitance change amount.

Otherwise, the CPU 12 detects the capacitance change amount equal to or more than the threshold TH1, and then detects that, before elapse of the predetermined period (N in S103), the capacitance change amount has reached the threshold TH2 (Y in S105). In this case, when the CPU 12 detects a capacitance change amount equal to or more than TH2 and less than TH3 for the predetermined period (for example, for 0.5 seconds) (Y in S106), the CPU 12 outputs the information item "!," which is assigned to a combination of this capacitive element 11s and the threshold TH2 (S107).

Still otherwise, the CPU 12 detects the capacitance change amount equal to or more than the threshold TH2, and then detects that, before elapse of the predetermined period (N in S106), the capacitance change amount has reached the threshold TH3 (Y in S108). In this case, when the CPU 12 detects a capacitance change amount equal to or more than TH3 for the predetermined period (for example, for 0.5 seconds) (Y in S109), the CPU 12 outputs the information item "NU," which is assigned to a combination of this capacitive element 11s and the threshold TH3 (S110).

When the CPU 12 does not detect that the capacitance change amount has reached the threshold TH1 (N in S102), the CPU 12 successively detects capacitive elements 11s each having the capacitance change amount less than the threshold TH1, and outputs an information item corresponding to a path along a series of the capacitive elements 11s (S111). In other words, the user is allowed to input information to the input unit 11 with a gesture.

(1-6. Conclusion)

As described above, according to this embodiment, the user continues to press the key top 121 at a constant rate without interruption so as to apply a load to the key top 121. The dome portion 119 converts the load that is applied to the key top 121 to stepwise positional changes between the conductive layer 122 and the capacitive element 11s. Further, the CPU 112 detects the plurality of different capacitance change amounts of the capacitive element 11s respectively at the multistage positions of the conductive layer 122 (displacement amount of the conductive layer 122) with respect to the capacitive element 11s, and outputs the different information items corresponding to the plurality of detected capacitance change amounts. By appropriately selecting the shape of the dome portion 119 (sizes and inclination angles of the first, the second and the third parts 1191, 1192, and 1193) and the thresholds of the capacitance change amounts, a load necessary for the elastic deformation of the dome portion 119 can be arbitrarily selected. Further, in order to input information items assigned to each of the keys, the user needs to actively click the key such that the capacitance change amount reaches at least the threshold TH1. Thus, when the capacitance change amount does not reach the threshold TH1, the user is allowed to input an information item to the input unit 11 by a low-load gesture operation. Further, in order to input the information items assigned to each of the keys, the CPU 112 needs to detect the capacitance change amounts for the predetermined period. Thus, erroneous inputs (erroneous operations) can be prevented.

With this configuration, the user can separately input the plurality of information items only by pressing a single key top 121. Further, at the time of pressing the key top 121 so as to input these information items, the user can feel the changes of the repulsive force from the dome portion 119 as the first to the third click feelings. With this, the user can tactilely recognize the multistage positions of the conductive layer 122 (displacement amount of the conductive layer 122) through intermediation of the key top 121. In other words, the user can tactilely recognize which of the information items the user is currently inputting. As a result, erroneous inputs (erroneous operations) can be prevented, and high operability can be achieved.

With the multistage key structure, information items that cannot be input without simultaneous operations of a plurality of keys in related art can be input by an operation of a single key. For example, in related art, in order to copy and paste a character string, "Ctrl" key and corresponding one of "C" key and "V" key need to be simultaneously operated at high frequency. Thus, particularly when these operations are repeated again and again, there is a risk that fingering is complicated. In addition, there is another risk that the repetitive simultaneous operations of the plurality of keys induce typing errors. With the configuration according to this embodiment, for example, an alphabet "C" may be input by first clicking of "C" key (capacitance change amount equal to or more than TH1 and less than TH2), and a character string may be copied by second clicking of "C" key (capacitance change amount equal to or more than TH2 and less than TH3). In this way, operations of copying frequently-used character strings can be performed by operations of a single key. Thus, fingering can be simplified. As a result, typing errors can be prevented, and operability can be improved.

Further, by simultaneously operating one multistage key (for example, having three stages) and another multistage key (for example, having three stages), even a plurality of information items (in this case, nine types of 3×3) can be input. With this, what is called shortcut operations of various types can be performed.

In addition, the multistage switch device according to the technology disclosed in Patent Literature 1 has a complicated structure including a plurality of dome springs. Further, a capacitive-sensor-requiring processing circuit and a contact switch circuit need to be additionally provided, and hence the numbers of components and manufacturing steps are large. The configuration of this embodiment is mechanically simple in that a multistage key is formed of the dome portion 119 that elastically retains the conductive layer 122 with respect to the capacitive element 11s. In addition, the plurality of dedicated circuits need not be provided.

2. Second Embodiment

In the following description, components, operations, functions, and the like, which are the same as the components, the operations, the functions, and the like of the embodiments described hereinabove are not described, and differences therebetween are mainly described. Further, the reference symbols of the components and the step numbers of the operations, which are the same as those of the embodiments described hereinabove, are used also in the following embodiments so as to represent the same components and the same operations.

(2-1. Control Unit)

In the first embodiment, the CPU 12 detects a capacitance change amount equal to or more than a predetermined capacitance change amount for a predetermined period, and output an information item corresponding to the predetermined capacitance change amount. Meanwhile, in the second embodiment, when the CPU 12 detects the capacitance change amount equal to or more than the predetermined capacitance change amount, and then detects that a position at which the capacitance change amount is detected has shifted, the CPU 12 outputs the information item corresponding to the predetermined capacitance change amount. Specifically, the user clicks the key top 121 with his/her finger, and then slightly slides the finger (in other words, releases the finger from the clicked key top 121 so as to cause the key top 121 to pop up). At this time, the CPU 12 detects the capacitance change amount equal to or more than the predetermined capacitance change amount, which is generated by the clicking, and then detects that the position at which the capacitance change amount is detected has shifted by the sliding.

Figure 10:
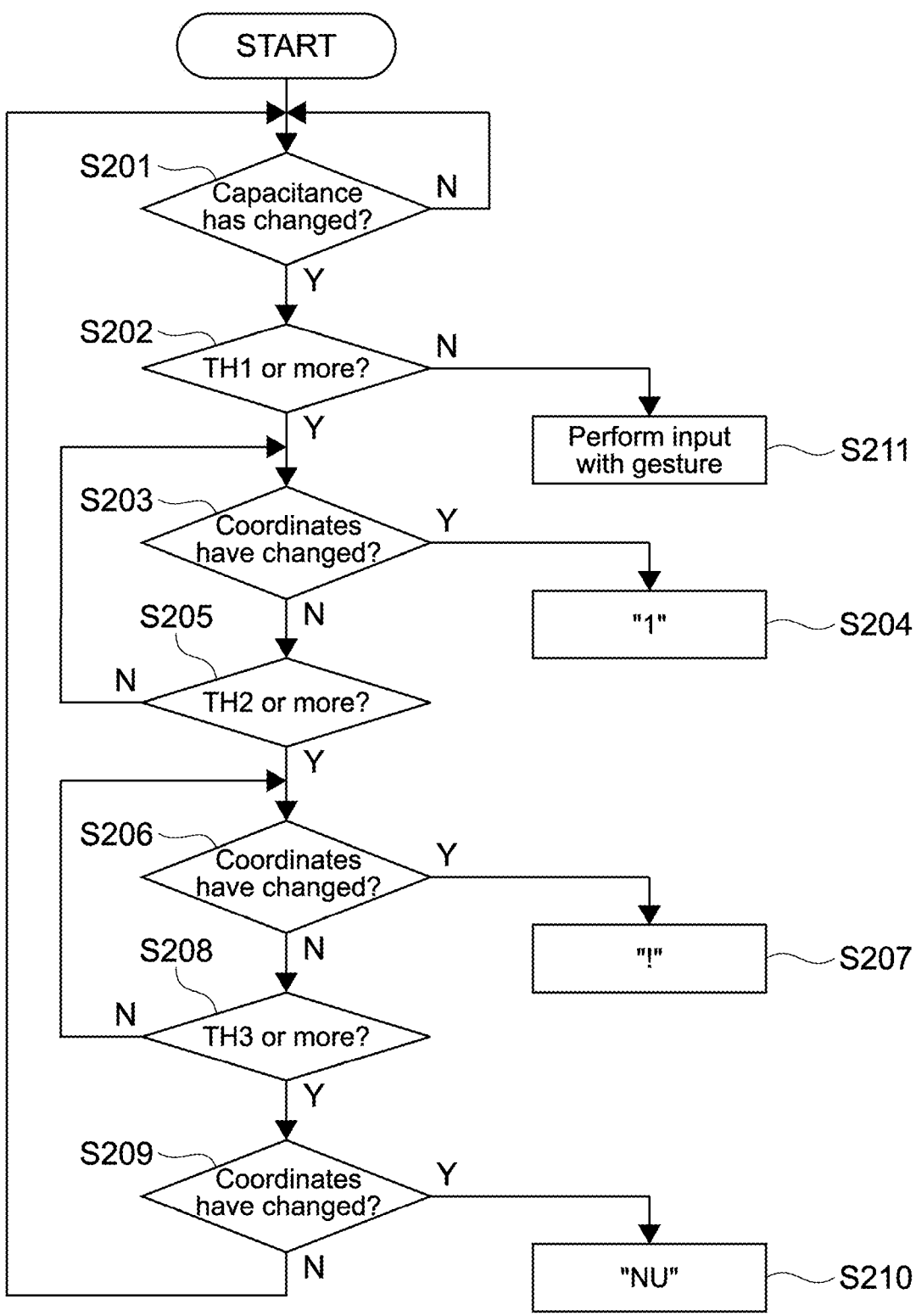
FIG. 10 is a flowchart showing an example of an operation of the CPU (control unit) according to a second embodiment.

FIG. 10 is a flowchart showing an example of an operation of the CPU 12 (control unit) according to a second embodiment.

The CPU 12 detects that a capacitance of the capacitive element 11s corresponding to a certain one key top 121 (arranged directly under the key top 121) has changed (Y in S201), and then detects that a capacitance change amount of this capacitive element 11s has reached the threshold TH1 (Y in S202). In this case, when the CPU 12 detects that a position at which the capacitance change amount is detected has shifted (Y in S203), the CPU 12 outputs the information item "1," which is assigned to the combination of this capacitive element 11s and the threshold TH1 (S204).

Otherwise, the CPU 12 detects the capacitance change amount equal to or more than the threshold TH1, then does not detect that the position at which the capacitance change amount is detected has shifted (N in S203), and detects that the capacitance change amount has reached the threshold TH2 (Y in S205). In this case, when the CPU 12 detects that the position at which the capacitance change amount is detected has shifted (Y in S206), the CPU 12 outputs the information item "!," which is assigned to the combination of this capacitive element 11s and the threshold TH2 (S207).

Still otherwise, the CPU 12 detects the capacitance change amount equal to or more than the threshold TH2, then does not detect that the position at which the capacitance change amount is detected has shifted (N in S206), and detects that the capacitance change amount has reached the threshold TH3 (Y in S208). In this case, when the CPU 12 detects that the position at which the capacitance change amount is detected has shifted (Y in S209), the CPU 12 outputs the information item "NU," which is assigned to the combination of this capacitive element 11s and the threshold TH3 (S210).

When the CPU 12 does not detect that the capacitance change amount has reached the threshold TH1 (N in S202), the CPU 12 successively detects capacitive elements 11s each having the capacitance change amount less than the threshold TH1, and outputs an information item corresponding to a path along a series of the capacitive elements 11s (S211). In other words, the user is allowed to input information to the input unit 11 with a gesture.

(2-2. Conclusion)

In the first embodiment, the CPU 12 detects a predetermined capacitance change amount for a predetermined period (for example, for 0.5 seconds), and then outputs an information item corresponding to the predetermined capacitance change amount. In other words, it takes at least the predetermined period (for example, for 0.5 seconds) from the detection of the predetermined capacitance change amount to the output of the information item. In contrast, in the second embodiment, such a waiting period is unnecessary, and hence a period from the key operation to the output of the information item is reduced. As a result, satisfactory responsiveness to the user can be achieved.

(2-3. Modification of Second Embodiment)

When the CPU 12 detects the capacitance change amount equal to or more than a predetermined capacitance change amount, and then detects that the position at which the capacitance change amount is detected has shifted, the CPU 12 may output an information item corresponding to the predetermined capacitance change amount and to a position after the shifting. In other words, when the user clicks the key top 121 with the finger and then slides the finger, the CPU 12 may detect the position of the slid finger after the shifting based on the change of the capacitance change amount, and output an information item corresponding to the position after the shifting. With this, a larger number of information items (for example, at least twelve types obtained by multiplication of "3" stages by "4" moving directions) can be input via a single multistage key. As a result, what is called shortcut operations of various types can be performed.

3. Third Embodiment

According to a third embodiment, the dome portion includes a plurality of elastic mechanisms including a part having a straight cross-section and a part having a curved cross-section in a cross-section along the Z direction. With this, the plurality of elastic mechanisms respectively have the different deformation resistances against the load that is applied to the conductive layer 122 through intermediation of the key top 121.

Figure 11:
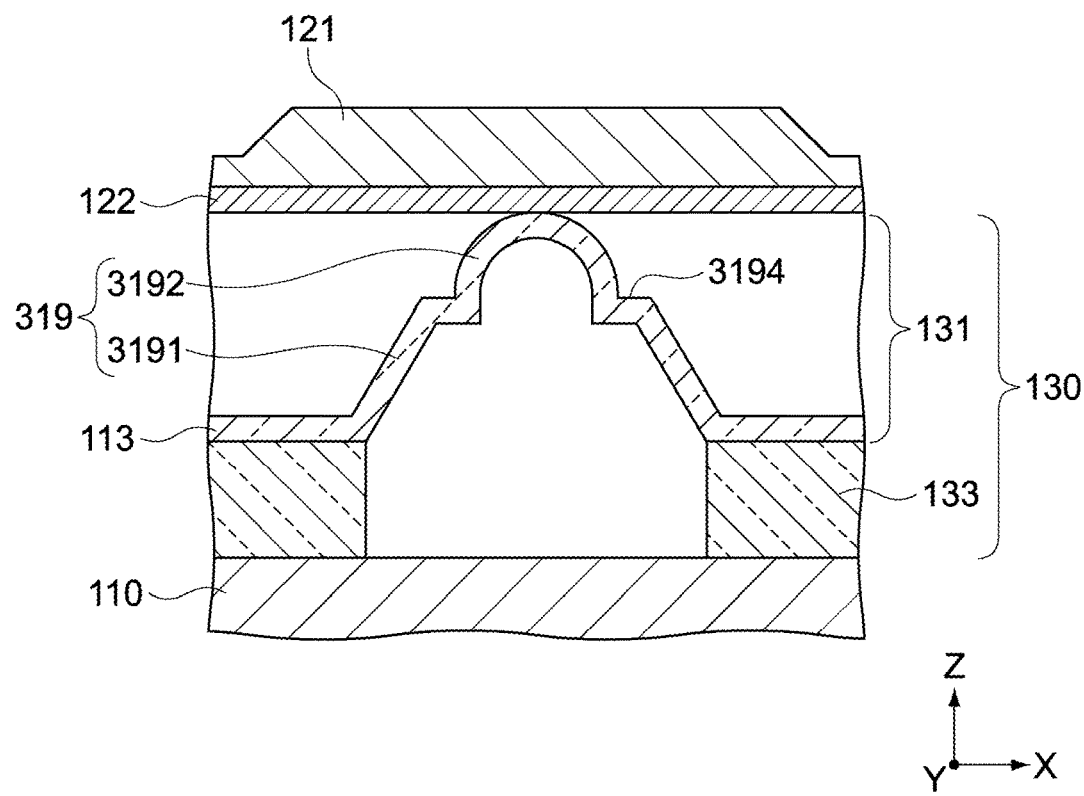
FIG. 11 is a schematic cross-sectional view of a configuration example of a dome portion according to a third embodiment.

FIG. 11 is a schematic cross-sectional view of a configuration example of the dome portion according to the third embodiment.

A dome portion 319 according to the third embodiment includes a hollow chiclet portion 3191 (elastic mechanism) and a hollow hemispherical portion 3192 (elastic mechanism). The chiclet portion 3191 is a substantially-quadrangular-truncated pyramid having the straight cross-section in the cross-section along the Z direction. The hemispherical portion 3192 is formed at an upper portion 3194 of the chiclet portion 3191 (part facing the conductive layer 122), and has a substantially hemispherical shape swelling toward the conductive layer 122 and having the curved cross-section in the cross-section along the Z direction. The hemispherical portion 3192 has a size and the shape in which the hemispherical portion 3192 is accommodated in an imaginary quadrangular pyramid formed by imaginarily extending side surfaces of the substantially-quadrangular-truncated pyramidal chiclet portion 3191. A top in the Z direction of the hemispherical portion 3192 (part farthest from the chiclet portion 3191) functions as the conductive-layer setting portion.

In this embodiment, the chiclet portion 3191 and the hemispherical portion 3192 have a geometric relationship as described above. Thus, when the chiclet portion 3191 and the hemispherical portion 3192 are equivalent in thickness to each other, the hemispherical portion 3192 is higher in deformation resistance against the load that is applied in the Z direction than the chiclet portion 3191. Therefore, a relationship of (deformation resistance of the chiclet portion 3191)<(deformation resistance of the hemispherical portion 3192) is established. With this, also in this embodiment, the position of the conductive layer 122 with respect to the capacitive element 11s is changed in a stepwise manner by elastic deformation of the chiclet portion 3191 having the lower deformation resistance at a preceding timing, and elastic deformation of the hemispherical portion 3192 having the higher deformation resistance at a subsequent timing in accordance with the load that is applied to the conductive layer 122 through intermediation of the key top 121.

4. Fourth Embodiment

Figure 12:
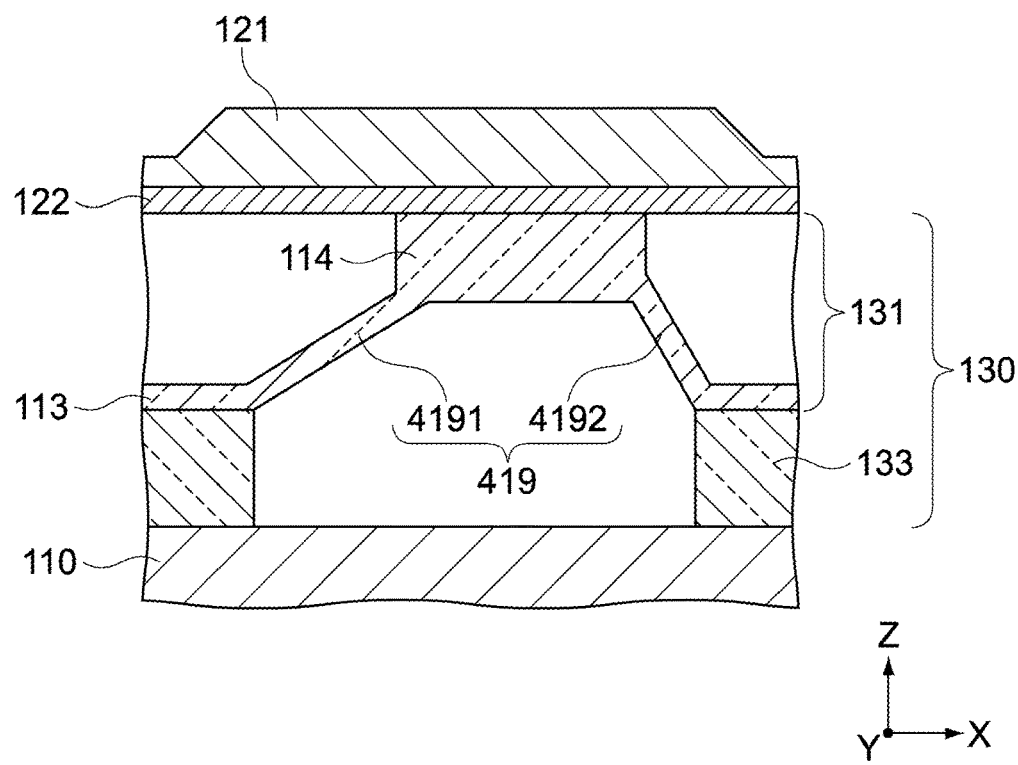
FIG. 12 is a schematic cross-sectional view of a configuration example of a dome portion according to a fourth embodiment.

FIG. 12 is a schematic cross-sectional view of a configuration example of a dome portion according to a fourth embodiment.

A dome portion 419 according to the fourth embodiment has a substantially-quadrangular-truncated pyramid shape. Four side surfaces (plurality of elastic mechanisms) of the substantially-quadrangular-truncated pyramid are inclined respectively at different angles with respect to the X-Y plane (in FIG. 12, only two side surfaces 4191 and 4192 are illustrated). In other words, the side surfaces 4191 and 4192 of the dome portion 419 are asymmetrical with each other (right-left asymmetry) as viewed in the Y direction. At the same time, other two side walls (not shown) are asymmetrical with each other (front-rear asymmetry) as viewed in the X direction. As described in the first embodiment, the deformation resistances against the load that is applied in the Z direction (vertical direction) become lower as the inclination angles become lower (closer to the horizon), and become higher as the inclination angles become higher (closer to the vertical). Therefore, also in this embodiment, in accordance with the load that is applied to the conductive layer 122 through intermediation of the key top 121, a side wall having a lowest inclination angle (lowest deformation resistance) is elastically deformed at a preceding timing, and a side wall having a highest inclination angle (highest deformation resistance) is elastically deformed at a subsequent timing. In this way, the four side walls are elastically deformed at different timings. With this, the position of the conductive layer 122 with respect to the capacitive element 11s is changed in a stepwise manner.

5. Fifth Embodiment

According to a fifth embodiment (not shown), the dome portion includes a plurality of parts respectively having different thicknesses. These parts respectively have the different deformation resistances against the load that is applied to the conductive layer 122 through intermediation of the key top 121, and are each configured to be elastically deformable. When inclination angles of the plurality of parts with respect to the X-Y plane are equal to each other, a part having a smaller thickness and a part having a larger thickness respectively become lower and higher in deformation resistance against the load that is applied in the −Z direction (vertical direction). Therefore, also in this embodiment, in accordance with the load that is applied to the conductor 122 through intermediation of the key top 121, a part having a smallest thickness (lowest deformation resistance) is elastically deformed at a preceding timing, and a part having a largest thickness (highest deformation resistance) is elastically deformed at a subsequent timing. In this way, the plurality of parts are elastically deformed at different timings. With this, the position of the conductor with respect to the capacitive element is changed in a stepwise manner.

6. Sixth Embodiment

Figure 13:
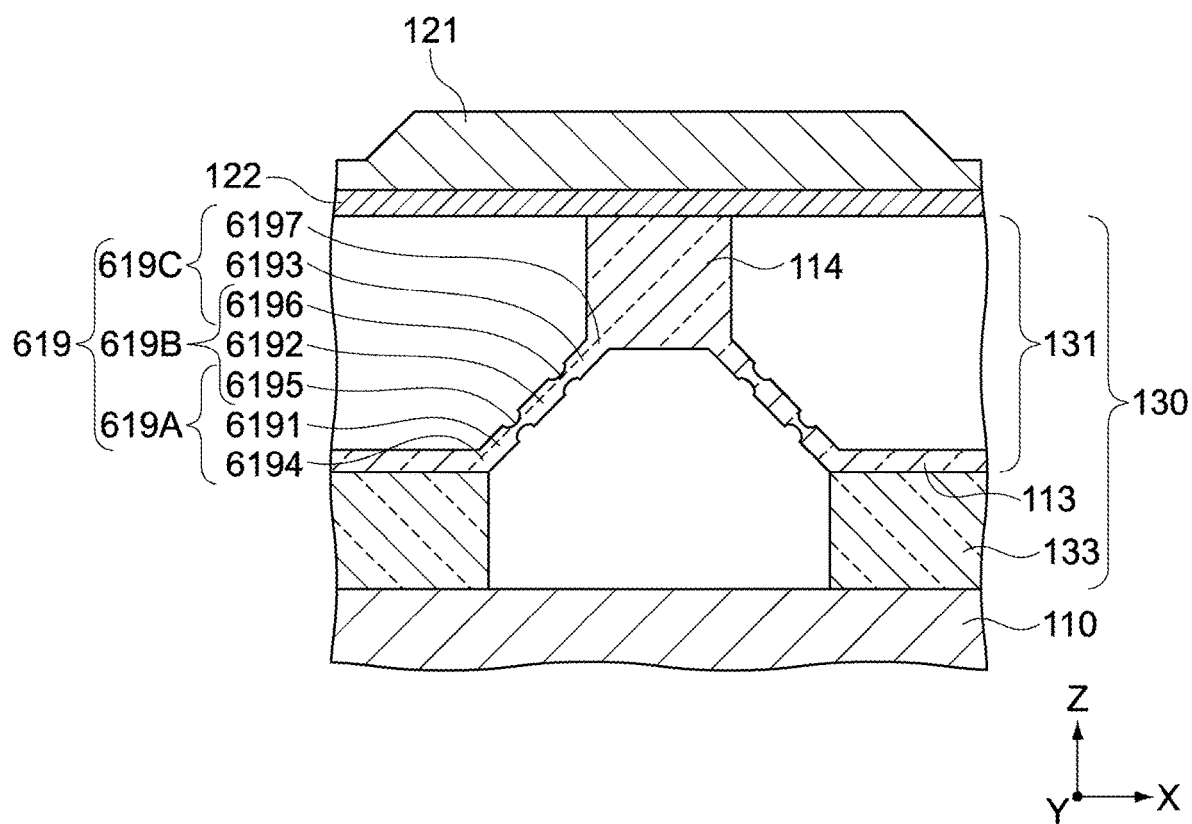
FIG. 13 is a schematic cross-sectional view of a configuration example of a dome portion according to a sixth embodiment.

FIG. 13 is a schematic cross-sectional view of a configuration example of a dome portion according to a sixth embodiment.

A substantially-truncated-conical dome portion 619 includes a first elastic mechanism 619A, a second elastic mechanism 619B, and a third elastic mechanism 619C each being elastically deformable and respectively having the different deformation resistances against the load that is applied to the conductive layer 122 through intermediation of the key top 121. The first, the second, and the third elastic mechanisms 619A, 619B, and 619C are arranged in this order from the sensor sheet 110 side toward the conductive layer 122 side and adjacent to each other in the Z direction.

The first elastic mechanism 619A, the second elastic mechanism 619B, and the third elastic mechanism 619C respectively include a first part 6191, a second part 6192, and a third part 6193. The first, the second, the third parts 6191, 6192, and 6193 cooperatively form a side surface of the substantially-truncated-conical dome portion 619, and each have an annular shape. The first, the second, the third parts 6191, 6192, and 6193 are typically equal to each other in inclination angle and thickness. The first elastic mechanism 619A includes, in addition to the first part 6191, an annular rising part 6194 rising from the base portion 113, and an annular first boundary portion 6195 being a boundary between the first part 6191 and the second part 6192. The second elastic mechanism 619B includes, in addition to the second part 6192, the first boundary portion 6195, and an annular second boundary portion 6196 being a boundary between the second part 6192 and the third part 6193. The third elastic mechanism 619C includes, in addition to the third part 6193, the second boundary portion 6196, and an annular third boundary portion 6197 being a boundary between the third part 6193 and the conductive-layer setting portion 114.

A thickness of the first boundary portion 6195 is smaller than a thickness of each of the first, the second, and the third parts 6191, 6192, and 6193. A thickness of the second boundary portion 6196 is smaller even than the thickness of the first boundary portion 6195. As described in the fifth embodiment, when the inclination angles of the plurality of parts with respect to the X-Y plane are equal to each other, the part having the smaller thickness and the part having the larger thickness respectively become lower and higher in deformation resistance against the load that is applied in the Z direction (vertical direction). Therefore, also in this embodiment, in accordance with the load that is applied to the conductor 122 through intermediation of the key top 121, the first boundary portion 6195 being the part having the smallest thickness (lowest deformation resistance) moves in the −Z direction at a preceding timing, and the second boundary portion 6196 having a second smallest thickness moves in the −Z direction at a subsequent timing. In this way, the first, the second, and the third elastic mechanisms 619A, 619B, and 619C are elastically deformed at different timings. With this, the position of the conductor with respect to the capacitive element is changed in a stepwise manner.

7. Other Embodiments

The difference between the controls by the CPU 12 (control unit) is described as the first and the second embodiments, and the differences between the shapes of the dome portions are described as the third to the sixth embodiments. The control by the CPU 12 (control unit) according to either one of the first and the second embodiments, and the dome portion according to any one of the third to the sixth embodiments can be combined with each other as appropriate. Further, the dome portions of at least two of the first to the sixth embodiments may be combined with each other. For example, the first and the sixth embodiments may be combined with each other such that the dome portion includes the plurality of parts having the different inclination angles, and the thin boundary portions having the different thicknesses between the parts. Alternatively, the first and the fifth embodiments may be combined with each other such that the dome portion includes the plurality of parts having the different inclination angles and the different thicknesses. Still alternatively, the dome portions of the at least two of the first to the sixth embodiments may be independently provided in the same electronic apparatus. Those combinations are merely examples.

The electronic apparatus 1 including the input unit 11 is not limited to the personal computer including the keyboard, which is cited as an example in the embodiments described hereinabove. For example, as other examples of the electronic apparatus 1 including the input unit 11, there are a remote controller for a television set or a video cassette recorder, which includes various buttons, a camera including a shutter button, and a wearable thin device including various buttons (such as smartwatch). In the remote controller, for example, "FAST-FORWARD PLAY" may be performed by the first clicking, and "CHAPTER SKIP" may be performed by the second clicking. In the camera, for example, "FOCUSING" may be performed by the first clicking, and "IMAGING" may be performed by the second clicking. In the smartwatch, for example, "STOPWATCH" may be activated by the first clicking, "WORLD WATCH" may be activated by the second clicking, and "TRANSMITTING E-MAIL RECEIVING INSTRUCTION TO SMARTPHONE" may be performed by the third clicking. By assigning a plurality of functions and complicated functions to a small number of buttons in this way, the number of buttons and the number of other components can be reduced. As a result, the electronic apparatus can be reduced in size and thickness.

8. Other Configurations of Present Technology

Note that, the present technology may also employ the following configurations.
(1) An input device, including:
  a capacitive element;
  a conductor that can be electrostatically coupled to the capacitive element;
  an operation portion that allows a load to be applied to the conductor; and
  a retaining portion that retains the conductor apart from the capacitive element, the retaining portion being capable of changing a position of the conductor with respect to the capacitive element in a stepwise manner in accordance with the load that is applied to the conductor through intermediation of the operation portion, the retaining portion being capable of retaining the conductor at a plurality of positions with respect to the capacitive element.
(2) The input device according to Item (1), further including a control unit that detects a plurality of different capacitance change amounts of the capacitive element respectively at the plurality of positions of the conductor with respect to the capacitive element, and outputs different information items corresponding to the plurality of detected different capacitance change amounts.
(3) The input device according to Item (1) or (2), in which
  the retaining portion includes a plurality of elastic mechanisms each being elastically deformable and respectively having different deformation resistances against the load that is applied to the conductor, and
  the plurality of elastic mechanisms are elastically deformed at different timings in accordance with the load that is applied to the conductor such that the conductor is displaced in a stepwise manner with respect to the capacitive element.
(4) The input device according to Item (2) or (3), in which,
  when the control unit detects a capacitance change amount equal to or more than a predetermined capacitance change amount for a predetermined period, the control unit outputs an information item corresponding to the predetermined capacitance change amount.
(5) The input device according to any one of Items (2) to (4), in which
  the capacitive element includes a plurality of capacitive elements arranged in matrix, and,
  when the control unit detects the capacitance change amount equal to or more than the predetermined capacitance change amount, and then detects that a position at which the capacitance change amount changes has shifted, the control unit outputs an information item corresponding to the predetermined capacitance change amount.
(6) The input device according to Item (5), in which, when the control unit detects the capacitance change amount equal to or more than the predetermined capacitance change amount, and then detects that the position at which the capacitance change amount is detected has shifted, the control unit outputs an information item corresponding to the predetermined capacitance change amount and to a position after the shifting.
(7) The input device according to any one of Items (1) to (6), in which the plurality of elastic mechanisms of the retaining portion include parts that are inclined respectively at different angles with respect to a plane perpendicular to the spacing direction such that the plurality of elastic mechanisms respectively have the different deformation resistances against the load that is applied to the conductor.
(8) The input device according to any one of Items (1) to (7), in which the plurality of elastic mechanisms of the retaining portion include a part having a straight cross-section and a part having a curved cross-section in a cross-section along the spacing direction such that the plurality of elastic mechanisms respectively have the different deformation resistances against the load that is applied to the conductor.
(9) The input device according to any one of Items (1) to (8), in which the plurality of elastic mechanisms of the retaining portion include parts respectively having different thicknesses such that the plurality of elastic mechanisms respectively have the different deformation resistances against the load that is applied to the conductor.
(10) An electronic apparatus, including:
  a capacitive element;
  a conductor that can be electrostatically coupled to the capacitive element;
  an operation portion that allows a load to be applied to the conductor;
  a retaining portion that retains the conductor apart from the capacitive element, the retaining portion being capable of changing a position of the conductor with respect to the capacitive element in a stepwise manner in accordance with the load that is applied to the conductor through intermediation of the operation portion, the retaining portion being capable of retaining the conductor at a plurality of positions with respect to the capacitive element; and
  a control unit that detects a plurality of different capacitance change amounts of the capacitive element respectively at the plurality of positions of the conductor with respect to the capacitive element, and outputs different information items corresponding to the plurality of detected different capacitance change amounts.
(11) The electronic apparatus according to Item (10), in which
  the retaining portion includes a plurality of elastic mechanisms each being elastically deformable and respectively having different deformation resistances against the load that is applied to the conductor, and
  the plurality of elastic mechanisms are elastically deformed at different timings in accordance with the load that is applied to the conductor such that the conductor is displaced in a stepwise manner with respect to the capacitive element.
(12) The electronic apparatus according to Item (10) or (11), in which, when the control unit detects a capacitance change amount equal to or more than a predetermined capacitance change amount for a predetermined period, the control unit outputs an information item corresponding to the predetermined capacitance change amount or more.
(13) The electronic apparatus according to any one of Items (10) to (12), in which
  the capacitive element includes a plurality of capacitive elements arranged in matrix, and, when the control unit detects the capacitance change amount equal to or more than the predetermined capacitance change amount, and then detects that a position at which the capacitance change amount changes has shifted, the control unit outputs an information item corresponding to the predetermined capacitance change amount or more.

(14) The electronic apparatus according to Item (13), in which, when the control unit detects the capacitance change amount equal to or more than the predetermined capacitance change amount, and then detects that the position at which the capacitance change amount is detected has shifted, the control unit outputs an information item corresponding to the predetermined capacitance change amount and to a position after the shifting.

(15) The electronic apparatus according to any one of Items (10) to (14), in which the plurality of elastic mechanisms of the retaining portion include parts that are inclined respectively at different angles with respect to a plane perpendicular to the spacing direction such that the plurality of elastic mechanisms respectively have the different deformation resistances against the load that is applied to the conductor.

(16) The electronic apparatus according to any one of Items (10) to (15), in which the plurality of elastic mechanisms of the retaining portion include a part having a straight cross-section and a part having a curved cross-section in a cross-section along the spacing direction such that the plurality of elastic mechanisms respectively have the different deformation resistances against the load that is applied to the conductor.

(17) The electronic apparatus according to any one of Items (10) to (16), in which the plurality of elastic mechanisms of the retaining portion include parts respectively having different thicknesses such that the plurality of elastic mechanisms respectively have the different deformation resistances against the load that is applied to the conductor.

REFERENCE SIGNS LIST 1 electronic apparatus
12 CPU
11s capacitive element
121 key top
122 conductive layer
119 dome portion

The invention claimed is:
1. An input device, comprising:
a capacitive element;
a conductor configured to electrostatically couple to the capacitive element;
an operation portion configured to apply a load to the conductor; and
a retaining portion configured to retain the conductor apart from the capacitive element, wherein
the retaining portion comprises a plurality of elastic portions,
each of the plurality of elastic portions has different thicknesses,
each of the plurality of elastic portions has different deformation resistances against the load applied to the conductor through the operation portion,
the plurality of elastic portions is configured to deform at different timings based on an increase in the load applied to the conductor,
a first elastic portion having a smallest thickness among the plurality of elastic portions is elastically deformed at a first timing based on the applied load,
a second elastic portion having a largest thickness among the plurality of elastic portions is elastically deformed at a second timing subsequent to the first timing based on the applied load, and
the retaining portion is further configured to:
displace the conductor with respect to the capacitive element in a stepwise manner in accordance with the load applied to the conductor through the operation portion; and
retain the conductor at a plurality of positions with respect to the capacitive element based on the different deformation resistances of the plurality of elastic portions against the load applied to the conductor.

2. The input device according to claim 1, further comprising a processor configured to:
detect a plurality of different capacitance change amounts of the capacitive element respectively at the plurality of positions of the conductor with respect to the capacitive element; and
output different information items corresponding to the plurality of different capacitance change amounts.

3. The input device according to claim 2, wherein
each portion of the plurality of elastic portions of the retaining portion includes an elastic mechanism that is elastically deformable based on the load that is applied to the conductor.

4. The input device according to claim 3, wherein
the processor is configured to:
detect a capacitance change amount that is equal to or more than a determined capacitance change amount for a determined period; and
output an information item corresponding to the determined capacitance change amount based on the detection of the capacitance change amount.

5. The input device according to claim 4, wherein
the plurality of elastic portions of the retaining portion include parts that are inclined respectively at different angles with respect to a plane perpendicular to a spacing direction such that the plurality of elastic portions respectively has the different deformation resistances against the load that is applied to the conductor.

6. The input device according to claim 4, wherein
the plurality of elastic portions of the retaining portion includes a first part that has a straight cross-section and a second part that has a curved cross-section in a cross-section along a spacing direction such that the plurality of elastic portions respectively have the different deformation resistances against the load that is applied to the conductor.

7. The input device according to claim 3, wherein
the capacitive element includes a plurality of capacitive elements arranged in a matrix, and
the processor is further configured to:
detect a capacitance change amount equal to or more than a determined capacitance change amount;
detect that a position at which the capacitance change amount changes has shifted; and
output an information item corresponding to the determined capacitance change amount based on the detection that the position has shifted.

8. The input device according to claim 7, wherein the processor is further configured to:

detect that the position at which the capacitance change amount is detected has shifted; and output the information item corresponding to the determined capacitance change amount and to the position after the shift.

9. The input device according to claim 8, wherein the plurality of elastic portions of the retaining portion include parts that are inclined respectively at different angles with respect to a plane perpendicular to a spacing direction such that the plurality of elastic portions respectively has the different deformation resistances against the load that is applied to the conductor.

10. The input device according to claim 8, wherein the plurality of elastic portions of the retaining portion includes a first part that has a straight cross-section and a second part that has a curved cross-section in a cross-section along a spacing direction such that the plurality of elastic portions respectively has the different deformation resistances against the load that is applied to the conductor.

11. An electronic apparatus, comprising:
a capacitive element;
a conductor configured to electrostatically couple to the capacitive element;
an operation portion configured to apply a load to the conductor;
a retaining portion configured to retain the conductor apart from the capacitive element, wherein
the retaining portion comprises a plurality of elastic portions,
each of the plurality of elastic portions has different thicknesses,
each of the plurality of elastic portions has different deformation resistances against the load applied to the conductor through the operation portion,
the plurality of elastic portions is configured to deform at different timings based on an increase in the load applied to the conductor,
a first elastic portion having a smallest thickness among the plurality of elastic portions is elastically deformed at a first timing based on the applied load,
a second elastic portion having a largest thickness among the plurality of elastic portions is elastically deformed at a second timing subsequent to the first timing based on the applied load;
displace the conductor with respect to the capacitive element in a stepwise manner in accordance with the load that is applied to the conductor through the operation portion; and
retain the conductor at a plurality of positions with respect to the capacitive element based on the different deformation resistances of the plurality of elastic portions against the load applied to the conductor; and
a processor configured to:
detect a plurality of different capacitance change amounts of the capacitive element at the plurality of positions of the conductor with respect to the capacitive element; and
output different signals corresponding to the plurality of different capacitance change amounts.

* * * * *